US008508946B2

United States Patent
Ching

(10) Patent No.: US 8,508,946 B2
(45) Date of Patent: Aug. 13, 2013

(54) CIRCUIT BOARD ASSEMBLY WITH COLOR-CHANGING LAYER

(75) Inventor: Min-An Ching, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 247 days.

(21) Appl. No.: 13/207,152

(22) Filed: Aug. 10, 2011

(65) Prior Publication Data

US 2012/0162937 A1    Jun. 28, 2012

(30) Foreign Application Priority Data

Dec. 24, 2010 (TW) .................................. 099145704

(51) Int. Cl.
*H05K 5/00* (2006.01)
*H05K 1/00* (2006.01)

(52) U.S. Cl.
USPC .............................. 361/737; 361/749; 439/67

(58) Field of Classification Search
USPC ................. 361/737, 749–751, 753, 755, 767, 361/771; 174/254, 256, 258, 261; 439/67; 340/636.14
See application file for complete search history.

(56) References Cited

U.S. PATENT DOCUMENTS

| 4,116,517 | A  | * | 9/1978  | Selvin et al. ..................... 439/67 |
| 4,235,500 | A  | * | 11/1980 | Belopavlovich et al. ..... 439/495 |
| 4,936,792 | A  | * | 6/1990  | Onoue et al. .................... 439/329 |
| 6,184,794 | B1 | * | 2/2001  | Tucholski .................. 340/636.14 |
| 6,388,194 | B1 | * | 5/2002  | Ryeczek ........................ 174/112 |
| 6,690,362 | B1 | * | 2/2004  | Motoyama et al. ........... 345/173 |
| 7,856,977 | B2 | * | 12/2010 | Jacobi ....................... 128/202.27 |
| 2002/0075622 | A1 | * | 6/2002  | Robinson ..................... 361/117 |
| 2012/0146463 | A1 | * | 6/2012  | Ng et al. ........................ 310/338 |
| 2013/0102184 | A1 | * | 4/2013  | Suzuki et al. ................. 439/374 |

* cited by examiner

*Primary Examiner* — Anatoly Vortman
*Assistant Examiner* — Jacob Crum
(74) *Attorney, Agent, or Firm* — Altis Law Group, Inc.

(57) ABSTRACT

A circuit board assembly includes a circuit board, a fixing device, and a color-changing layer. The fixing device is capable of holding and securing the circuit board and includes a main body and a cover. The cover is rotatably hinged to the main body. The color-changing layer is located on either or both of the circuit board and cover. When the circuit board is assembled at a predetermined position of the fixing device and is secured on the main body by the cover, the cover exerts a pressure to form protruding points on the color-changing layer at the positions corresponding to the elastic contacts, the color-changing generates an electric field and changes color, which is easily and quickly verifiable by a worker.

20 Claims, 7 Drawing Sheets

US 8,508,946 B2

CIRCUIT BOARD ASSEMBLY WITH COLOR-CHANGING LAYER

CROSS-REFERENCE TO RELATED APPLICATION

This application is related to a co-pending U.S. patent application, entitled "CIRCUIT BOARD ASSEMBLY", filed on Jul. 27, 2011 by Min-An Ching, with the application Ser. No. 13/191605 and assigned to the same assignee as the present application.

BACKGROUND

1. Technical Field

The disclosure generally relates to mechanical devices, and more particularly to a circuit board assembly used in assembling flexible printed circuit boards (FPCBs).

2. Description of the Related Art

FPCBs are widely used in electronic devices to mechanically support and electrically connect electronic components using conductive pathways. However, in assembly, it is difficult to visually determine whether the FPCBs are positioned correctly in the electronic device, which is inefficient and can result in a low yield rate.

Therefore, there is room for improvement within the art.

BRIEF DESCRIPTION OF THE DRAWINGS

Many aspects of a circuit board assembly can be better understood with reference to the following drawings. The components in the drawings are not necessarily drawn to scale, the emphasis instead being placed upon clearly illustrating the principles of the circuit board assembly. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
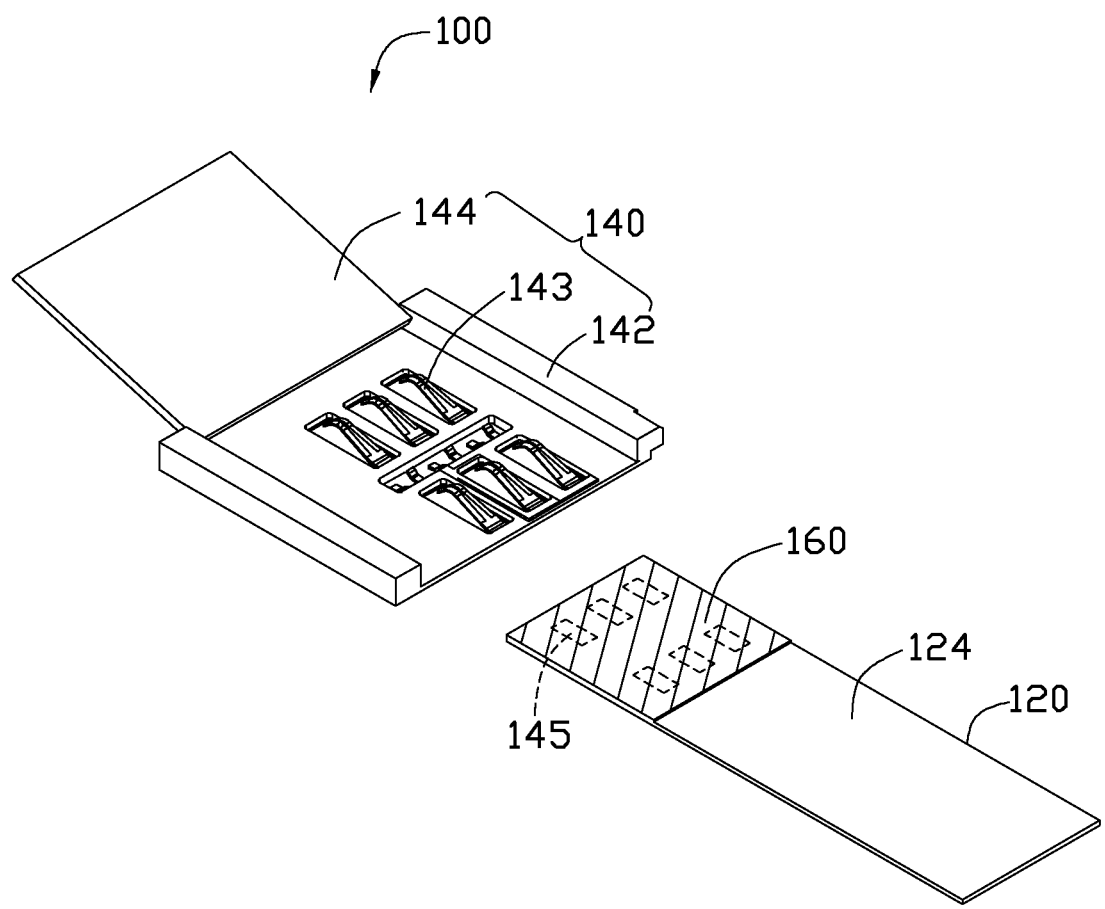
FIG. 1 is a schematic and exploded view of a circuit board assembly including a circuit board, according to a first embodiment of the disclosure.

FIG. 1 shows a schematic and exploded view of a circuit board assembly 100 including a circuit board 120, according to a first embodiment of the disclosure. The circuit board assembly 100 is further includes a fixing device 140 electrically connected and mechanically connected to the circuit board 120. The circuit board 120 is correctly positioned in an electronic device (not shown) through the fixing device 140.

Figure 2:
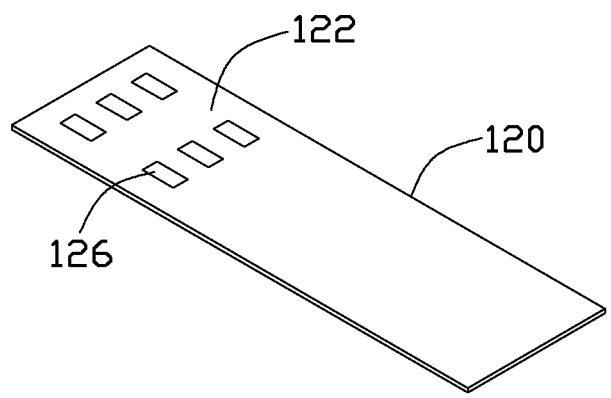
FIG. 2 is a schematic view of the circuit board shown in FIG. 1.
Figure 3:
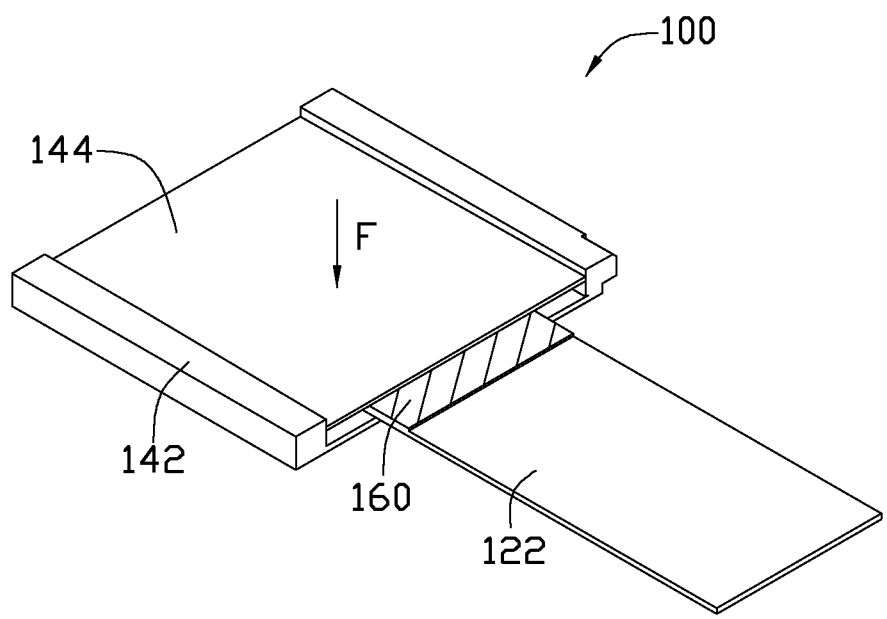
FIG. 3 is a schematic and assembled view of the circuit board assembly shown in FIG. 1 of this disclosure.

Referring to FIGS. 2 and 3, the circuit board 120 can be a flexible printed circuit board (FPCB), and is substantially shaped as a rectangular plate. The circuit board 120 is designed to mechanically support and electrically connect electronic components using conductive pathways. The circuit board 120 includes a first surface 122 and a second surface 124 substantially parallel to the first surface 122. The circuit board 120 further includes a plurality of circuit contacts 126.

The circuit board 120 is electrically connected to the fixing device 140 through the circuit contacts 126. The circuit contacts 126 are arranged and located on the first surface 122 and are electrically connected to the conductive pathways of the circuit board 120.

The fixing device 140 is to be fixed in the electronic device and is configured for securing and receiving the circuit board 120, and includes a main body 142, a plurality of elastic contacts 143, and a cover 144. The main body 142 is substantially shaped as a rectangular frame. The elastic contacts 143 are made from copper, steel or other metals, and are located on the main body 142. Each elastic contact 143 is to be aligned with a corresponding circuit contact 126 of the circuit board 120, and when the fixing device 140 is fixed within the electronic device, the elastic contacts 143 are placed in electrical contact with circuits of the electronic device. Thus, when the circuit board 120 is received within the fixing device 140 and the fixing device 140 is fixed within the electronic device, the circuit contacts 126 of the circuit board 120 are electrically connected to the circuitry of the electronic device through the elastic contacts 143. The cover 144 is substantially shaped as a rectangular plate and is mechanically connected to the main body 142 by means such as a hinge to hold and secure the circuit board 120 within the fixing device 140.

In this embodiment, when the circuit board 120 is received within the main body 142, the cover 144 is rotated down to the main body 142, and generates and exerts a downward pressure F on the circuit board 120. Thus, the circuit contacts 126 electrically contact the corresponding elastic contacts 143, and the circuit board 120 is secured and received in the fixing device 140.

The circuit board assembly 100 further includes a color-changing layer 160. The color-changing layer 160 is fixed on the second surface 124 using, for example, pressure-sensitive adhesives or thermosetting adhesives. The color-changing layer 160 is capable of changing color under the pressure F generated by the cover 144, and the cover 144 is made from transparent material to see the change of color-changing layer 160.

In this embodiment, each color-changing layer 160 is made from the mixture of piezoelectric material and electrochromic material according to a predetermined proportion. The proportion is determined by the pressure F to ensure the color-changing layer 160 can normally change color under a desired pressure F. In this embodiment, the piezoelectric material can be one or combinations of crystal polymer, such as $LiNbO_3$, $LiTaO_3$, film polymer, such as AlN, ZnO, and ceramic polymer, such as $BaCO_3$, PZT, or PVDF. The piezoelectric material can generate electricity resulting from pressure, such as the pressure F.

The electrochromic material can produce electrochemical redox reaction under the action of an electric field, and so stably and reversibly change colors. In this embodiment, the color conversion time (e.g., color fading time or coloration time) of the color-changing layer 160 is less than 250 milliseconds; the drive current for color conversion can be less than 6 $uA/cm^2$, and the holding time of the coloration is about 10 minutes. The electrochromic material can be anodizing coloring material, such as NIO, $IrO_2$ or $Fe[Fe(CN)_6]_3$, cathodic reduction coloring material, such as $WO_3$, $MnO_3$, $Nb_2O_3$ or $TiO_3$, or anodizing/cathodic reduction coloring material, such as $V_2O_5$, CoO or $Rh_2O_3$.

Referring to FIGS. 1, 2, and 3, in assembly, the circuit board 120 is inserted into the fixing device 140, which has been previously placed into electronic connection with the circuitry of the electronic device. The cover 144 is rotated relative to the circuit board 120 to hold and secure the circuit board 120 in the fixing device 140. The circuit board 120 resists against the elastic contacts 143 and the elastic force created by the depressed elastic contacts 143 form protruding points 145 on the color-changing layer 160 at the positions corresponding to the elastic contacts 143. Thus, the cover 144 exerts a downward pressure F on the protruding points 145 of the color-changing layer 160, and the piezoelectric material generates electricity resulting from the pressure F. If the circuit board 120 is correctly positioned, that is, the circuit contacts 126 are aligned with and electrically contacting their corresponding metal elastic contacts 143, an electric field for controlling the color-changing layer 160 is produced. Thus, the protruding points 145 on the color-changing layer 160 reversibly change color, indicating that circuit board 120 is properly positioned relative to the fixing device 140, and the circuit board 120 is assembled at the predetermined position relative to the fixing device 140. If at least one of the protruding points 145 on the color-changing layer 160 fails to change color, then that signifies that the downward pressure F is not fully exerted on the color-changing layer 160, and the circuit board 120 is not correctly positioned relative to the fixing device 140 and needs to be adjusted.

Figure 4:
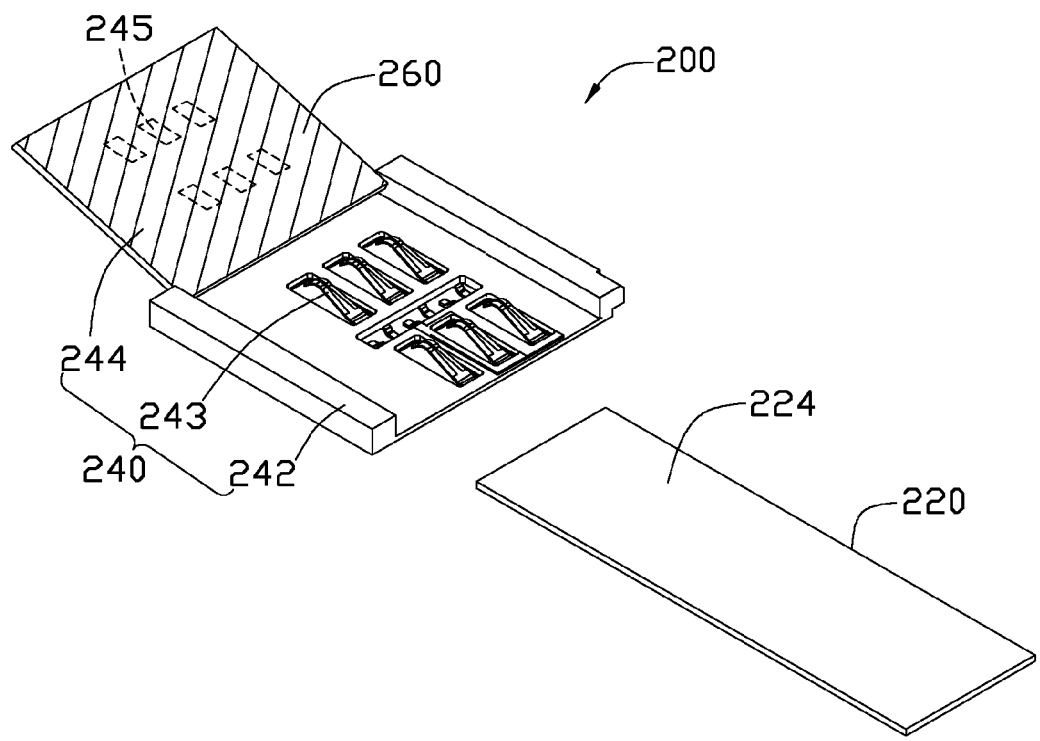
FIG. 4 is a schematic and exploded view of a circuit board assembly including a circuit board, according to a second embodiment of the disclosure.
Figure 5:
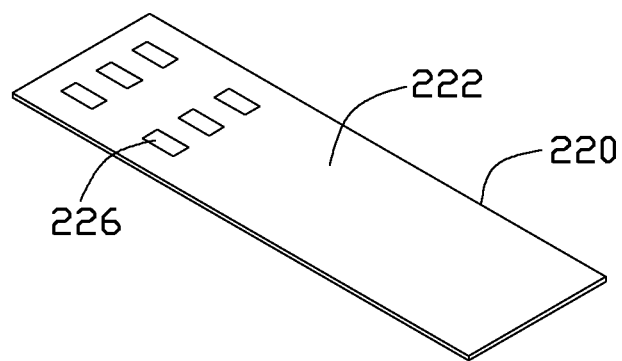
FIG. 5 is a schematic view of the circuit board shown in FIG. 4.
Figure 6:
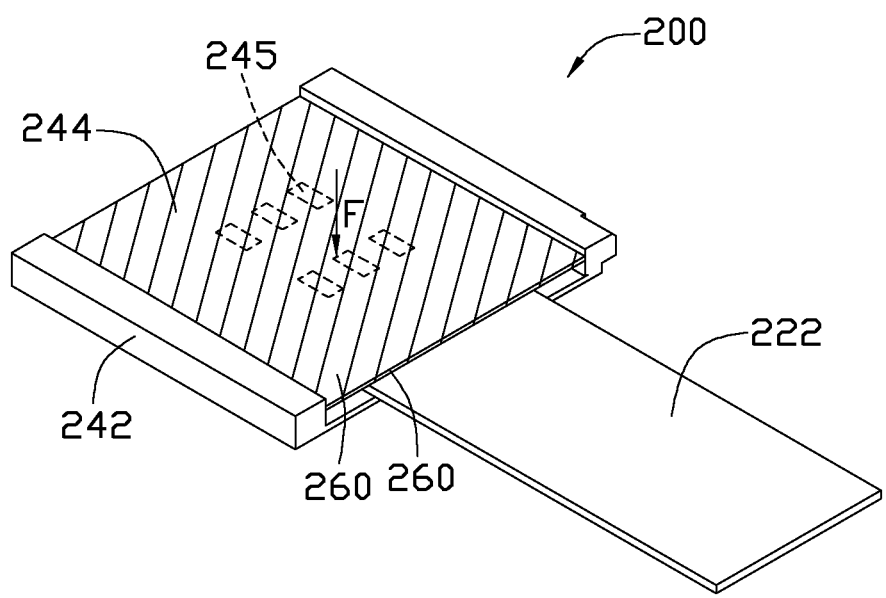
FIG. 6 is a schematic and assembled view of the circuit board assembly shown in FIG. 4 of this disclosure.

Referring to FIGS. 4, 5 and 6, a circuit board assembly 200 according to a second embodiment includes a circuit board 220, a fixing device 240, and a color-changing layer 260. The circuit board assembly 200 is similar as principle to the circuit board assembly 100 of the first embodiment, except that the color-changing layer 260 is located at a different location from that of the circuit board assembly 100.

In this embodiment, the circuit board 220 includes a first surface 222, a second surface 224 substantially parallel to the first surface 222, and a plurality of circuit contacts 226 on the second surface 224. The fixing device 240 includes a main body 242, a plurality of elastic contacts 243 corresponding to the circuit contacts 226, and a cover 244. The cover 244 can be made from transparent material such as acrylic to view the color change of the inside layer of the cover 244. The color-changing layer 260 is fixed on the opposite surfaces of the cover 244 using pressure-sensitive adhesives or thermosetting adhesives. Thus, when the cover 244 is placed on the circuit board 220, the circuit board 220 is held between the cover 244 and the elastic contacts 243, the color-changing layer 260 resists against the elastic contacts 243. If the circuit board 220 is correctly positioned, the color-changing layer 260 changes its color at the protruding points 245, where the elastic contacts 243 contact the corresponding circuit contacts 226.

Moreover, the cover 244 can be completely made from the mixture of the piezoelectric material and the electrochromic material. Thus, when the circuit board 220 is correctly positioned relative to the fixing device 240, the cover 244 can change color under the pressure F.

Figure 7:
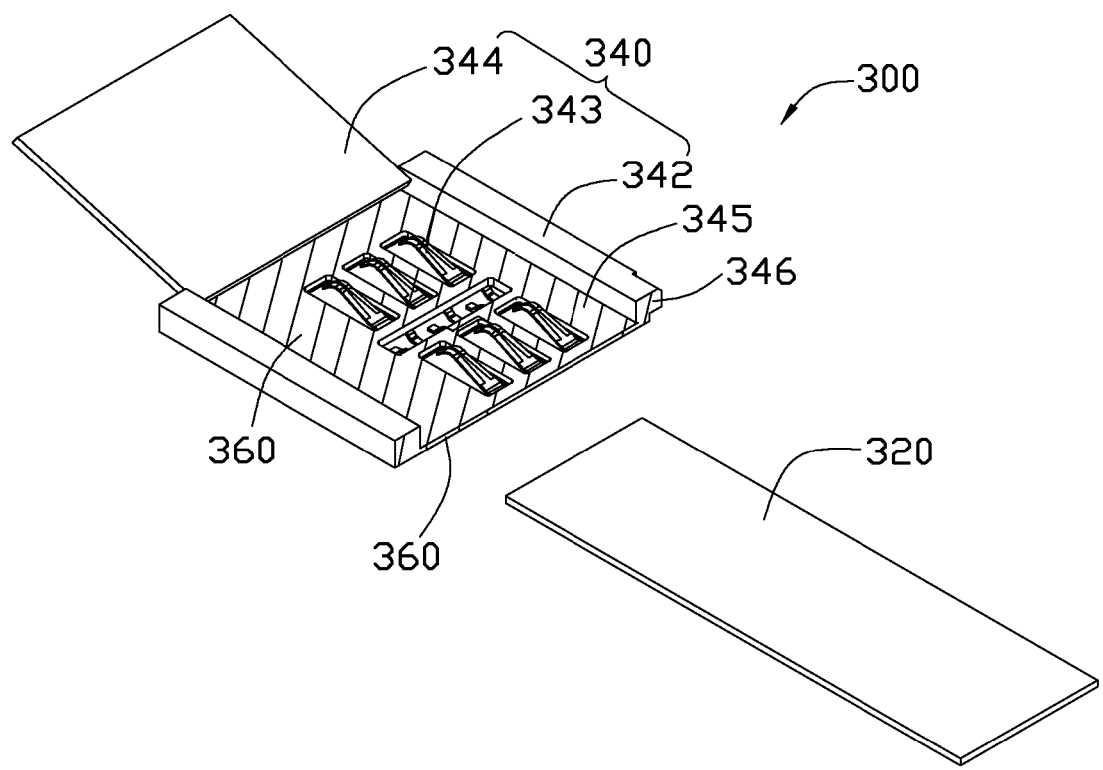
FIG. 7 is a schematic and exploded view of a circuit board assembly including a circuit board, according to a third embodiment of the disclosure.

Referring to FIG. 7, a circuit board assembly 300 according to a third embodiment includes a circuit board 320, a fixing device 340, and a color-changing layer 360. The circuit board assembly 300 is similar as principle to the circuit board assembly 100 of the first embodiment, except that the color-changing layer 360 is located at different locations from that of the circuit board assembly 100.

In this embodiment, the fixing device 340 includes a main body 342, a plurality of elastic contacts 343, and a cover 344. The main body 342 includes bottom surface 345 and an end surface 346, and the end surface 346 is connected to the bottom surface 345. The elastic contacts 343 are positioned at substantially the middle of the bottom surface 345. The cover 344 is made from transparent material such as acrylic. The color-changing layer 360 is fixed on the bottom surface 345 and covers the elastic contacts 343 using pressure-sensitive adhesives or thermosetting adhesives. When the circuit board 320 is correctly positioned relative to the fixing device 340, the circuit board 320 resists against and contacts the color-changing layer 360 on the elastic contacts 343. Thus, the thin color-changing layer 360 changes color at the position of the protruding points 345 where the elastic contacts 343 contact the circuit board 320.

Moreover, the cover 344 can be completely made from the piezoelectric material and the electrochromic material. Thus, when the circuit board 320 is correctly positioned relative to the fixing device 340, the cover 344 can change color at the circuit contact positions.

In summary, in the circuit board assembly of this disclosure, the color-changing layer can be set on the circuit board, the main body of the fixing device or the cover. Thus, when the circuit board is correctly assembled to the fixing device at the predetermined position, the cover will exert a downward pressure on the color-changing layer, and the color-changing layer will change color, which is easily and quickly verifiable by a worker.

In the present specification and claims the word "a" or "an" preceding an element does not exclude the presence of a plurality of such elements. Further, the word "comprising" does not exclude the presence of other elements or steps than those listed.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A circuit board assembly comprising:
a circuit board for supporting electronic components;
a fixing device for holding and securing the circuit board, the fixing device comprising:
a main body for holding the circuit board; and
a cover rotatably connected to the main body for securing the circuit board to the main body; and
a color-changing layer located on at least one of the circuit board and the cover, wherein the color-changing layer can change color under pressure, and when the circuit board is assembled at a predetermined position relative to the fixing device and is secured to the main body by the cover, the cover exerts pressure on portions of the circuit board causing changes to the color of the color-changing layer.

2. The circuit board assembly as claimed in claim 1, wherein the circuit board is a flexible printed circuit board.

3. The circuit board assembly as claimed in claim 2, wherein the circuit board comprises a first surface, a second surface parallel to the first surface, and a plurality of circuit contacts, the circuit board is electrically connected to the fixing device through the circuit contacts, and the circuit contacts are arranged and located on the first surface and are electrically connected to conductive pathways of the circuit board.

4. The circuit board assembly as claimed in claim 3, wherein the fixing device further comprises a plurality of elastic contacts, the elastic contacts are located on the main body and each elastic contact is aligned with a corresponding circuit contact, and when the circuit board is received within the main body, the cover is rotated down to the main body and generates and exerts the pressure on the circuit board, the circuit contacts electrically contact their corresponding elastic contacts, and the circuit board is secured and received in the fixing device.

5. The circuit board assembly as claimed in claim 3, wherein the color-changing layer is fixed on the second surface using adhesives.

6. The circuit board assembly as claimed in claim 1, wherein the cover is at least translucent and color-changing layer is fixed on the opposite surfaces of the cover using adhesives.

7. The circuit board assembly as claimed in claim 4, wherein the main body comprises a bottom surface and an end surface connected to the bottom surface, the elastic contacts are positioned at substantially the middle of the bottom surface, the color-changing layer is fixed on the bottom surface and covers the elastic contacts using pressure-sensitive adhesives or thermosetting adhesives.

8. The circuit board assembly as claimed in claim 1, wherein the color-changing layer is made from the mixture of piezoelectric material and electrochromic material, the piezoelectric material is one or combinations of $LiNbO_3$, $LiTaO_3$, film polymer, AlN, ZnO, $BaCO_3$, PZT, or PVDF to generate electricity resulting from pressure, and the electrochromic material is NIO, $IrO_2$, $Fe[Fe(CN)_6]_3$, $WO_3$, $MnO_3$, $Nb_2O_3$, $TiO_3$, $V_2O_5$, CoO or $Rh_2O_3$, and is capable of producing electrochemical redox reaction under the action of electric field to generate and display stable and reversible color change.

9. The circuit board assembly as claimed in claim 1, wherein the color fading time and coloration time of the color-changing layer is less than 250 milliseconds, the drive current for color conversion is less than 6 $uA/cm^2$, and the holding time of the coloration is about 10 minutes.

10. The circuit board assembly as claimed in claim 4, wherein the cover is rotated towards the circuit board and exerts a downward pressure on the color-changing layer, if the circuit board is correctly positioned relative to the fixing device, the circuit contacts are electrically connected to the corresponding elastic contacts, and the color-changing layer changes color; if the circuit board is not correctly positioned, the color-changing layer does not change color.

11. A circuit board assembly comprising:
a circuit board comprising a plurality of circuit contacts at one side of the circuit board;
a fixing device that holds and secures the circuit board, the fixing device comprising:
a main body for holding the circuit board;
an at least translucent cover rotatably connected to the main body for securing the circuit board to the main body; and
a plurality of elastic contacts, each elastic contact located on the main body and corresponding to one of the circuit contacts; and
a color-changing layer, wherein the color-changing layer comprises a mixture of piezoelectric material and electrochromic material and is located on the cover, the circuit board or the circuit contacts, when the circuit board is assembled at a predetermined position relative to the fixing device, the circuit contacts are aligned with and electrically contacted to the corresponding elastic contacts, the cover resists against and exerts pressure against portions of the circuit board to form protruding points on the color-changing layer at the positions corresponding to the elastic contacts, the color-changing layer generates an electric field and changes color.

12. The circuit board assembly as claimed in claim 11, wherein the circuit board is a flexible printed circuit board.

13. The circuit board assembly as claimed in claim 12, wherein the circuit board comprises a first surface and a second surface parallel to the first surface, the circuit board is electrically connected to the fixing device through the circuit contacts, and the circuit contacts are arranged and located on the first surface and are electrically connected to conductive pathways of the circuit board.

14. The circuit board assembly as claimed in claim 13, wherein each elastic contact is aligned with a corresponding circuit contact, and when the circuit board is received in the main body, the cover is rotated down to the main body and generates and exerts the pressure on the circuit board, the circuit contacts electrically contact their corresponding elastic contacts, and the circuit board is secured and received in the fixing device.

15. The circuit board assembly as claimed in claim 11, wherein the color-changing layer is fixed on the other side of the circuit board opposite their contacts using adhesives.

16. The circuit board assembly as claimed in claim 11, wherein the color-changing layer is fixed on the opposite surfaces of the at least translucent cover using adhesives.

17. The circuit board assembly as claimed in claim 11, wherein the main body comprises a bottom surface and an end surface connected to the bottom surface, the elastic contacts are positioned at substantially the middle of the bottom surface, the color-changing layer is fixed on the bottom surface, and covers the elastic contacts using pressure-sensitive adhesives or thermosetting adhesives.

18. The circuit board assembly as claimed in claim 11, wherein the piezoelectric material is one or combinations of $LiNbO_3$, $LiTaO_3$, film polymer, AlN, ZnO, $BaCO_3$, PZT, or PVDF to generate electricity resulting from pressure, and the electrochromic material is NIO, $IrO_2$, $Fe[Fe(CN)_6]_3$, $WO_3$, $MnO_3$, $Nb_2O_3$, $TiO_3$, $V_2O_5$, CoO or $Rh_2O_3$, and is capable of producing electrochemical redox reaction under the action of electric field to generate and display stable and reversible color change.

19. The circuit board assembly as claimed in claim 18, wherein the color fading time and coloration time of the color-changing layer is less than 250 milliseconds, the drive current for color conversion is less than 6 $uA/cm^2$, and the holding time of the coloration is about 10 minutes.

20. The circuit board assembly as claimed in claim 11, wherein the cover and the main body are made from the piezoelectric material and the electrochromic material, and when the circuit board is correctly positioned relative to the fixing device, and the cover exerts a downward pressure on the color-changing layer, the circuit contacts are electrically connected to the corresponding elastic contacts, the color-changing layer changes color.

* * * * *